Figure 1:
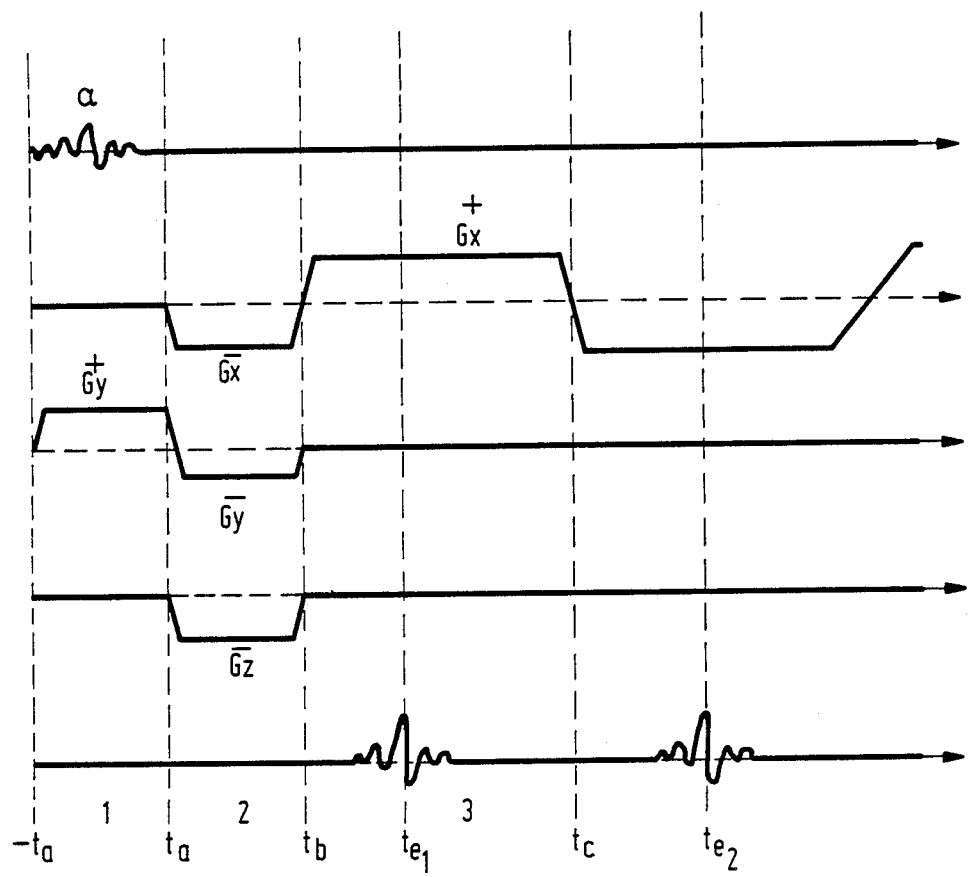

United States Patent [19]

van der Meulen et al.

[11] Patent Number: 4,742,301

[45] Date of Patent: May 3, 1988

[54] MAGNETIC RESONANCE IMAGING METHOD UTILIZING SMALL EXCITATION PULSES

[75] Inventors: Peter van der Meulen; Johannes P. Groen; Johannes J. M. Cuppen, all of Eindhoven, Netherlands

[73] Assignee: U.S. Philips Corporation, New York, N.Y.

[21] Appl. No.: 871,010

[22] Filed: Jun. 5, 1986

[30] Foreign Application Priority Data

Jun. 12, 1985 [NL] Netherlands ........................ 8501685
Aug. 14, 1985 [NL] Netherlands ........................ 8502249

[51] Int. Cl.$^4$ ............................................ G01N 24/08
[52] U.S. Cl. ...................................... 324/309; 324/307
[58] Field of Search ........................ 324/307, 309, 312

[56] References Cited

U.S. PATENT DOCUMENTS 4,506,222  3/1985  Edelstein et al. ................... 324/309
4,607,223  8/1986  Mallard et al. ..................... 324/309

Primary Examiner—Michael J. Tokar
Assistant Examiner—Louis M. Arana
Attorney, Agent, or Firm—Algy Tamoshunas

[57] ABSTRACT

In known spin echo imaging examination a waiting period is customarily observed between two successive spin echo measurements in order to allow for the magnetic moment to relax in the direction of the uniform magnetic field Bo. In addition to this waiting period, the use of 180° pulses also leads to a comparatively long examination time which increases the risk of image artefacts due to motions of, for example a patient to be examined. This comparatively long examination time is also unfavorable in view of the radiation load. In order to avoid these drawbacks, a method is proposed in which the electromagnetic pulses used are exclusively excitation pulses in the form of $\alpha°$ pulses, where $0 < \alpha < 90$.

18 Claims, 3 Drawing Sheets

MAGNETIC RESONANCE IMAGING METHOD UTILIZING SMALL EXCITATION PULSES

The invention relates to a method of determining a nuclear magnetization distribution in a region of a body which is situated in a steady, uniform magnetic field. Such a method comprises measurement cycles including the following steps:

(a) influencing spin nuclei in the selected region of the body by means of high-frequency electromagnetic pulses which include $\alpha°$ pulses which rotate the magnetization direction of spin nuclei in the region through an angle $\alpha°$, where $0<\alpha<90$, (b) applying a preparatory magnetic field gradient during a preparation period, (c) sampling the resonance signal during a measurement period (d) repeating measurement cycles each time with a different value of the time integral of the magnetic field gradient specified in paragraph (b).

The invention also relates to a device for determining the nuclear magnetic resonance distribution in a region of a body, comprising:

(a) means for generating a steady, uniform magnetic field, (b) means for generating a high-frequency electromagnetic excitation pulse (c) means for generating a preparatory magnetic field gradient during a preparation period, (d) sampling means for taking signal samples, during a measurement period, of a resonance signal generated by the means specified in paragraphs (a) and (b), after conditioning of the resonance signal during a preparation period in the presence of the magnetic field gradient generated by the means specified in paragraph (c), (e) processing means for processing the signals supplied by the sampling means, and (f) control means for controlling the means specified in paragraphs (b) to (e) for generating, conditioning, sampling and processing a plurality of resonance signals, each resonance signal being conditioned during a preparation period, the control means supplying the means specified in paragraph (c) with control signals for adjusting the intensity and/or duration of the magnetic field gradient, the integral of the intensity over the duration of the magnetic field gradient being different after each repetition of cycles, the control means comprising programmed computer means for generating and applying control signals to the means for generating high-frequency electromagnetic pulses.

Such a method is known from EP No. 0,137,420.

Devices for determining a nuclear magnetization distribution in a region of a body and the principles on which the operation of such devices is based are known, for example from the article "Proton NMR tomography" in Philips Technical Review, Volume 41, 1983/84, no. 3, pages 73–88. Reference is made to this article for the description of the construction and principles.

In a method described in EP No. 0,137,420, a body to be examined is exposed to a strong, steady, uniform magnetic field Bo whose direction coincides with, for example the z-axis of a cartesian (s, y, z) coordinate system. The steady magnetic field Bo causes a slight polarization of the spin nuclei in the body and enables the spin nuclei to perform a precessional motion about the direction of the magnetic field Bo. After application of the magnetic field Bo, a magnetic field gradient which acts as a selection gradient is applied and at the same time an $\alpha°$ r.f. pulse is generated which rotates the magnetization direction of the nuclei present in the selected slice through an angle $\alpha°$. After termination of the $\alpha°$ pulse, the spin nuclei will perform a processional motion about the field direction of the magnetic field Bo, thus generating a resonance signal (FID signal). After the $\alpha°$ pulse, there are simultaneously applied field gradients $G_y$, $G_x$ and $G_z$ whose field direction coincides with that of the magnetic field Bo and whose gradient directions extend in the y, the x and the z direction, respectively. The field gradients $G_x$, $G_y$ and $G_z$ serve for rephasing and coding the spin nuclei in the x, the y and the z direction, respectively. After termination of these three field gradients and after application of a 180° echo pulse, a field gradient $G_x$ is applied, an echo resonance signal of the original FID signal then being sampled.

In order to obtain an image of a selected region, a measurement cycle is repeated a number of times with a different value of the time integral of the field gradient $G_y$ and/or $G_z$ during each cycle. By arranging the Fourier transforms of the resonance signals according to increasing value of the time integral of the field gradient $G_y$, on the one hand, and the field gradient $G_z$, on the other hand and by subjecting these values to a Fourier transformation in the y-direction and subsequently in the z-direction, a spin density distribution will be obtained as a function of x, y and z.

In accordance with the method disclosed in the patent application EP No. 0,137,420, a 180° echo pulse must be generated between the preparation and the measurement in order to generate a resonance signal, thus ensuring that a nuclear spin echo will be generated. A drawback of this the known method is that, because of the use of 180° pulses during the comparatively short period of a measurement cycle, a high-frequency load arises, which is unfavourable, for example for a patient to be examined as well as for a high-frequency pulse transmitter. Another drawback is that the use of 180° pulses the preparation period and the measurement period and the introduction of a waiting period between successive cycles results in an unnecessarily long examination time because, for example no action whatsoever is undertaken during the waiting period, thus increasing the risk of artefacts in the image due to motions of, for example, a patient to be examined.

It is the object of the invention to provide a method and a device which enable the formation of NMR images in which the waiting period between two successive cycles can be completely or almost completely dispensed with As a result, for example the spin density distribution or the longitudinal relaxation time $T_1$ can be determined faster than in the inversion recovery method. At the same time, a high-r.f. load is avoided for a patient to be examined, as well as for the equipment. The invention can also be used to achieve further advantages, that is to say either the highest image frequency can be amplified so that the edges of the image are better defined, or the highest image frequency can be additionally filtered so that the signal-to-noise ratio is enhanced.

A method of the kind set forth in accordance with the invention is characterized in that the electromagnetic pulses are exclusively excitation pulses in the form of $\alpha°$ pulses, the successive measurement cycles being directly or substantially directly consecutive, and the spin nuclei being rephased by means of a magnetic field gradient which has been inverted with respect to the magnetic field gradient applied during the preparation period.

Due to the high-frequency electromagnetic α° pulse, where $0<\alpha<90$, the magnetization M will perform a precessional motion at an angle α about the direction of the uniform, steady magnetic field Bo, so that the resonance signal ultimately obtained will be proportional to the transverse component $M_t$ of the magnetization M. This transverse component will have disappeared some time after the resonance signal, because on the one hand a field gradient present during a measurement period ensures further dephasing in the measurement direction and on other hand the magnitude of this component is reduced by $T_2$ relaxation. The longitudinal component $M_1$ of the magnetisation M, however, will meanwhile increase to its original magnitude due to $T_1$ relaxation. After termination of the measurement period, a similar measurement cycle can be repeated with only a very brief waiting period (in the order of magnitude of the measurement period) or even without a waiting period. Under the influence of a second α° pulse, the longitudinal component $M_1$ of the magnetization M which originally performs a precessional motion at an angle α° about the direction of the steady, uniform magnetic field Bo under the influence of the first α° pulse, now performs a precessional motion at an angle α° about the same direction. The measurement signal ultimately obtained will be proportional to the transverse component of the originally longitudinal component $M_1$ of the magnetization M.

A preferred version of a method in accordance with the invention is characterized in that one or more sequences of a number of cycles are performed with different intensities of the excitation pulse and/or different values of a repetition period $T_R$ of successive excitation pulses. The image intensity per pixel depends on the local proton density p in the excited slice, the longitudinal relaxation time $T_1$, and the transverse relaxation time $T_2$; these quantities are roughly the three constituent components of the nuclear magnetization distribution in the layer. Using said further preferred version, two or more images of the selected slice can be obtained in which different types of tissues or tissue conditions can be recognized in the best manner because these images can be adapted to the proton density p and the relaxation times $T_1$ and $T_2$.

A further version is characterized in that per measurement cycle N, resonance signals are sampled during N successive measurement periods, the gradient direction of a magnetic field gradient present during a measurement period always being inverted during a subsequent measurement period. Generation of more than one resonance signal per cycle in this manner allows for the known calculation of the transverse relaxation time $T_2$ from the line through the logarithm of the amplitudes of the resonance signals as a function of time in a cycle.

A further version is characterized in that the preparatory magnetic field gradient is inverted during the preparation period. In this version the preparatory magnetic field has a constant amplitude and one polarity during a first period $t_1$ and an opposite polarity in a second period $t_2$, the duration of the periods $t_1$ and $t_2$ being variable with the sum of the periods $t_1$ and $t_2$ being equal to the preparation period. When the constant parts of the gradient waveforms are stored in digital form and the value of the gradient can be varied from one cycle to another only by means of the parameters $t_1$ and $t_2$, the computer transport time required between two cycles will be less than in cases where each time a completely new gradient waveform has to be loaded before the beginning of each cycle.

A further version is characterized in that in order to dephase undesirable components of the magnetization in a measurement direction, a magnetic field gradient applied during a measurement period immediately after a resonance signal to be measured is sustained for some time immediately after expiration of a measurement period and/or a magnetic field gradient is applied for some time prior to the generating of an α° pulse during a cycle.

A further version is characterized in that during a period of motion of an object to be examined, resonance signals are generated which correspond to different phases of the period of motion of the object, said resonance signals being processed so as to form images which can be displayed in a sequence. These so-called multiphase triggered images form a chronological representation of a complete image of the phases of a period of motion of the object (for example the heart).

A further version is characterized in that the longitudinal relaxation time $T_1$ per volume element is calculated from the intensities of volume elements in an image which have been obtained from at least two cycles which differ either as regards the angle α and/or the repetition time $T_R$ between two successive α° pulses.

A further version is characterized in that the longitudinal relaxation time $T_1$ is calculated by means of the formula:

$$Ip = \frac{c \sin \alpha (1 - e^{-TR/T1})}{(1 - \cos \alpha \, e^{-TR/T1})}$$

in which Ip is the intensity of a volume element p, α is the angle α, $T_R$ is the repetition time $T_R$, $T_1$ is the longitudinal relaxation time $T_1$, and c is a constant which does not depend on α, $T_R$ or $T_1$. When the intensities of volume elements in an image are measured from at least two cycles which differ as regards the angle α and/or the repetition time $T_R$, the longitudinal relaxation time $T_1$ per volume element can be calculated, using the above formule, from at least two equations with two unknowns (that is to say, Ip, α, $T_R$ are known, c and $T_1$ are unknown).

A further version is characterized in that the magnetic field gradient applied during the preparation period contains a linear combination of two mutually perpendicular magnetic field gradients. Thus, the spin nuclei are encoded in two mutually perpendicular directions so that a three-dimensional image of an excited slice is obtained.

A further version is characterized in that the resonance signals of the cycles which differ as regards the value of the time integral of the preparatory magnetic field gradient are sampled in a sequence of either increasing or decreasing absolute value of the time integral. It is thus achieved that either the highest image frequencies are amplified so that the edges in the image are better defined or the highest image frequency is additionally filtered so that the signal-to-noise ratio is reduced.

A further preferred version is characterized in that there is performed a measurement during which, at an interval a preparatory r.f. electromagnetic θ-pulse is generated, θ having an arbitrary value, and a subcycle which includes the steps (a), (b) and (c) is repeated K times. In this version, the resonance signal is sampled during the respective subcycles at instants spaced at different time intervals from the instant at which the r.f. electromagnetic θ-pulse has been generated. During each repetition of the subcycle, the the time integral of the intensity over the duration of the preparatory magnetic field gradient has the same value.

As will be demonstrated hereinafter, information as regards the longitudinal relaxation times $T_1$ of different chemical components in an excited region of a body can be obtained by measuring, at different instants during the longitudinal relaxation process, the instantaneous magnetization which is oriented in the transverse plane due to the influencing by the r.f. electromagnetic pulses present during the measurement cycle, said instantaneous magnetization being measured in the form of echo resonance signals.

In a further embodiment, wherein the measurement subcycle is repeated K times with the same value of the time integral referred to above, the entire measurement cycle is repeated a number of times, by generating another θ pulse at the end of the last of the K subcycles. During the next sequence of K subcycles the value of the time integral of the intensity over the duration of the preparatory magnetic field gradient is again constant but different from the value that the time integral had in the preceding cycle. That is, the value of the time integral of the preparatory gradient is different for each repetition of the measurement cycle while remaining constant during the sequence of K subcycles of a given measurement cycle. An image can thus be reconstructed at any desired instant during the longitudinal relaxation process.

A further version is characterized in that the preparatory r.f. electromagnetic θ-pulse is an r.f. electromagnetic 180°-pulse.

A device in accordance with the invention is characterized in that the control means are programmed to generate exclusively α° pulses, where 0 < α < 90, and inverted magnetic field gradients in a preparation period or a measurement period.

A preferred embodiment of a device in accordance with the invention is characterized in that the sampling means sample the resonance signals of the cycles which differ as regards the value of the time integral of the preparatory magnetic field gradient in a sequence of either decreasing or increasing absolute value of the time integral.

Figure 3:
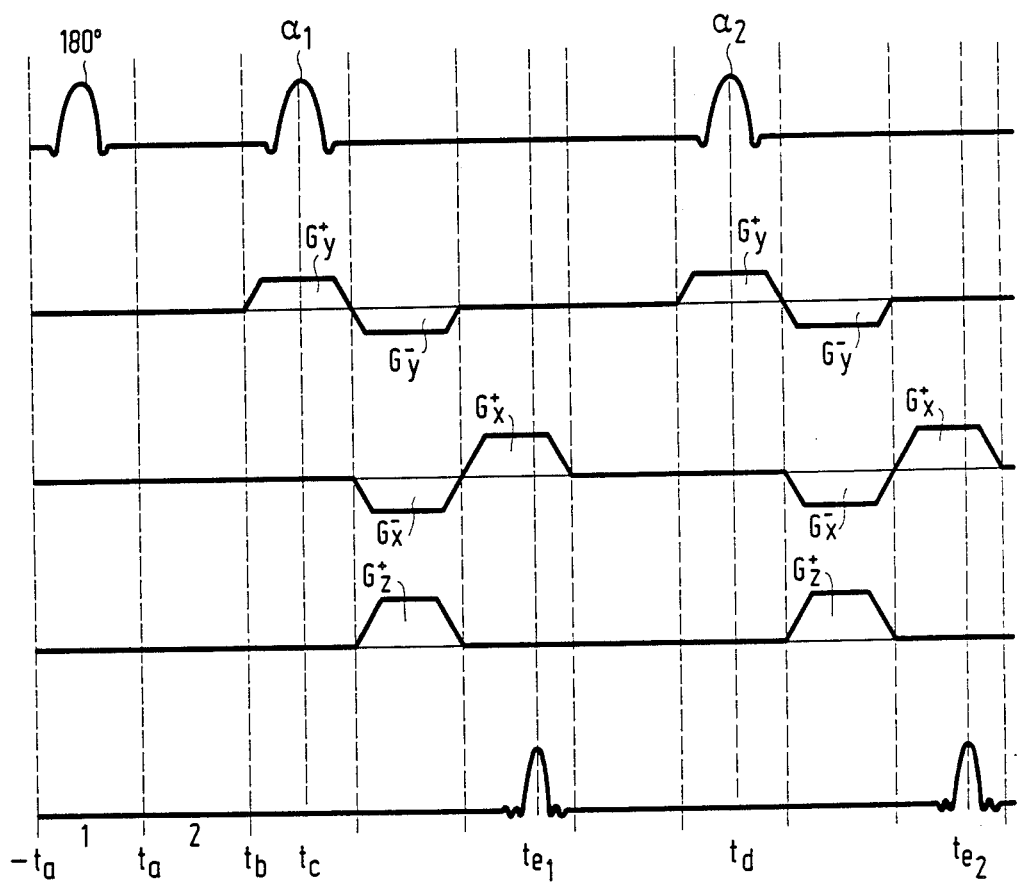
Figure 4:
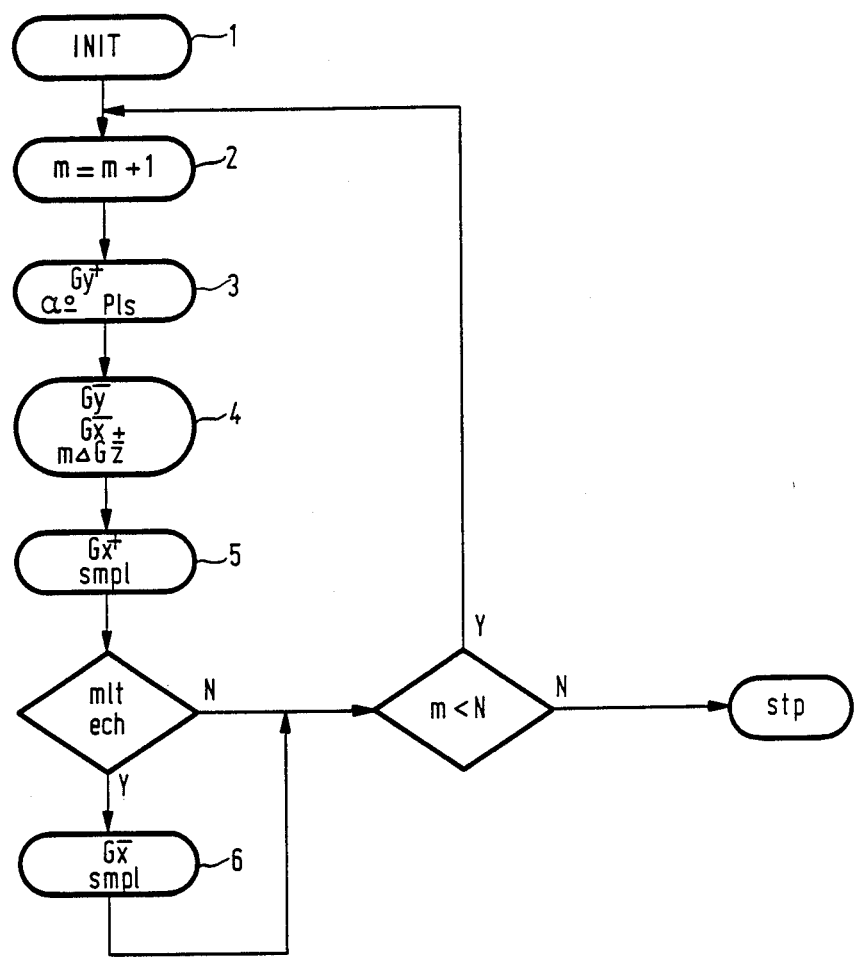

The invention will be described in detail hereinafter on the basis of a pulse sequence of an embodiment shown in FIG. 1, a so-called $(\alpha° - T_R)_N$ pulse sequence shown in FIG. 2, a pulse sequence of an embodiment shown in FIG. 3, and a flowchart of a method in accordance with the invention as shown in FIG. 4.

A convention orthogonal system of coordinates is considered in which a steady, uniform magnetic field Bo is directed along the z-axis and a high-frequency electromagnetic field is directed along the y-axis. Also provided are coils for producing $G_x$, $G_y$ and $G_z$ gradients in the x, the y and the z-direction, respectively. A patient is arranged in the horizontal position, the z-axis extending vertically and the y-axis extending horizontally with respect to the longitudinal direction of the patient. Hereinafter, the polarity as indicated by a +, − notation, for example in $G_y^+$, indicates whether the field direction of a field gradient is positive or negative, respectively.

During the interval 1 in FIG. 1, bounded by the instant $t = -t_a$ and $t = t_a$, a magnetic field gradient $G_y^+$ is applied and at the same time a high-frequency electromagnetic α° pulse is generated. (In practice α lies between 20 and 80 degrees). Consequently, the spin nuclei are excited in the plane $Y = Y_o$, which means that the magnetization generated by the spin nuclei in the plane $Y - = Y_o$ performs a precessional motion at an angle α° about the z-axis. Due to the bandwidth of the α° pulse, spin nuclei will be excited not only in the plane $Y = Y_o$, but also in the direct vicinity thereof. By variation of the frequency of the α° pulse, spin nuclei can be excited in any other plane parallel to the plane $Y = Y_o$.

During preparation the interval 2, bounded by the instants $t = t_a$ and $t = t_b$, three magnetic field gradients $G_x^-$, $G_y^-$ and $G_z^\pm$ are applied. In order to save time, these three field gradients are applied during the same time interval. However, because no α° pulses are generated during this interval, the effects of the field gradients can be separately considered. The negative gradient $G_y^-$ rephase the spin nuclei in the y direction so that the spin nuclei which are selectively excited in and in the direct vicinity of the plane $Y = Y_o$ no longer experience phase discrimination in the y direction. Therefore it approximately holds good that $$\frac{1}{2} \int_{-t_a}^{t_a} G_y^+ \, dt = \int_{t_a}^{t_b} | G_y^- | \, dt \text{ (rephasing condition)} \quad (1)$$

(The factor ½ in the left-hand term compensates for the fact that the α° pulse acts effectively only halfway the interval bounded by the instants $t = -t_a$ and $t = t_a$). Thus, the maximum value of the signal to be ultimately obtained is achieved. This is because, if the individual spin nuclei were to perform a processional motion out of phase about the z-axis, the transverse component of the magnetization, being proportional to the ultimate measurement signal, would be substantially equal to zero. The magnetic field gradients $G_x^-$ and $G_z^\pm$ serve to dephase the spin nuclei in the x and the z direction, respectively. Phase encoding is thus realized in the latter direction.

During the interval 3, bounded by the instants $t = t_b$ and $t = t_c$, a positive gradient $G_x^+$ is applied in order to rephase the spin nuclei in the x direction; these spin nuclei which will produce a spin echo in the plane $Y = Y_o$ at the instant at which the phase discrimination in the x direction terminates. This instant $(t = t_{e1})$ is found from the following equation:

$$\int_{t_a}^{t_b} G_x^- \, dt = \int_{t_b}^{t_{e1}} G_x^+ \, dt \text{ (spin echo condition)} \quad (2)$$

After the instant $t = t_{e1}$, the spin nuclei are further dephased in the x direction by the gradient $G_x^+$. Because the magnetization M performs a processional motion about the z axis at an angle α°, the resonance signal ultimately obtained will be proportional to the transverse component $M_t$ of the magnetization M. After some time, this transverse component $M_t$ will no longer be present because, on the one hand, the field gradient $G_x^+$ causes further dephasing and, on the other hand, the magnitude of the component $M_t$ is reduced by $T_2$ relaxation. The longitudinal component $M_1$ will meanwhile have increased due to $T_1$ relaxation.

After the instant $t=t_c$, the same cycle can be repeated, without observing a waiting period or by observing only a brief waiting period. A high-frequency electromagnetic pulse of the next cycle causes a precessional motion at an angle $\alpha°$ of the longitudinal component $M_1$ of the magnetization M which performs a precessional motion about the z axis at an angle $\alpha°$ under the influence of the first $\alpha°$ pulse. The signal ultimately obtained is proportional to the transverse magnetization $M_t'$:

$$M_t' = M_1 \sin \alpha \qquad (3)$$

The longitudinal magnetization $M_1'$ equals:

$$M_1' = M_1 \cos \alpha \qquad (4)$$

During a next cycle, the component $M_1'$ is again rotated through an angle $\alpha°$ by an $\alpha°$ pulse, and the signal ultimately obtained will be proportional to the transversal component of the component $M_1'$. The transverse component of the component $M_t'$ does not contribute to the measurement signal, because the field gradient $G_x+$ causes further dephasing after the resonance signal so that prior to the start of a new cycle there will be no component present in the transverse (measurement) direction.

The magnetic field gradient $G_z\pm$ serves to provide phase encoding in the z direction. This is because, when the field gradient $G_z\pm$ is terminated at the instant $t=t_b$, nuclei in the z direction will have the same precessional frequency but a different precessional phase. The phase angle variation experienced by a nucleus in dependence of its position in the z direction will be proportional to the local intensity of the field gradient $G_z\pm$. The sum of all spin vector contributions N of a column of nuclei in the z direction is proportional to a specific image frequency in the z direction at the area of the column nuclei. The magnitude of this sum is proportional to the magnitude of $G_z\pm$.

By repeating the above cycle a number of times for different values of the field gradient $G_z\pm$, a complete two-dimensional image of a selected slice in the z-x plane can be obtained.

It is definitely not necessary to start a new measurement cycle after the instant $t=t_c$. By inverting the gradient direction of a magnetic field gradient $G_x+$ present during the measurement period (tb−tc) during a subsequent measurement period, a second resonance signal can be generated and sampled at the instant $t=t_{e2}$.

Figure 2:
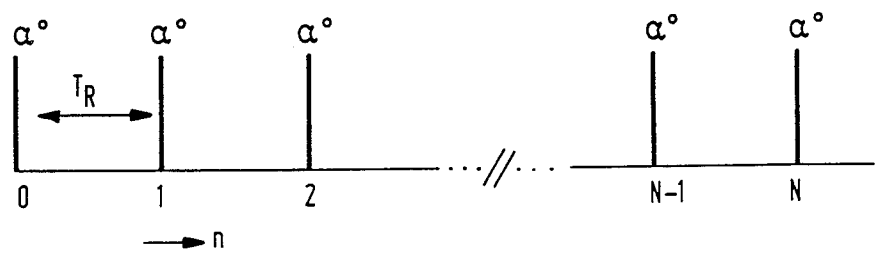

FIG. 2 shows a so-called $(\alpha°-T_R)_N$ pulse sequence, i.e. a sequence of N $\alpha°$ pulses which are successively generated at intervals $T_R$. When the magnetization M is directed along the z axis for the first $\alpha°$ pulse and the transversal magnetization $M_t$ is substantially equal to zero just before each $\alpha°$ pulse due to dephasing and relaxation, the following relation holds good for the transverse magnetization $M_{tN}$ immediately after the $N^{th}$ $\alpha°$ pulse:

$$M_{tN} = M_{te} + (M_{to} - M_{te}) e^{-N/N_\tau} \quad N \geq 0 \qquad (5)$$

where $$M_{to} = M \sin \alpha \qquad (6)$$

-continued $$M_{te} = \frac{M \sin \alpha (1 - e^{-TR/T1})}{(1 - \cos \alpha\, e^{-TR/T1})} \qquad (7)$$

$$N_\tau = \frac{1}{T_R/T_1 - \ln \cos \alpha} \qquad (8)$$

in which $T_R$ is the repetition period, $T_1$ is the longitudinal relaxation time, $M_{to}$ is the transverse magnetization for $N=0$, and $M_{te}$ is a transverse equilibrium magnetization. As appears from the equation (5), the transverse magnetisation $M_{tN}$ tends towards a transverse equilibrium magnetization after N $\alpha°$ pulses. This effect is referred to as a "switch-on" effect. When after each $\alpha°$ pulse of $(\alpha°-T_R)_N$ pulse series resonance signals are generated by means of the gradients used in the embodiment shown in FIG. 1 and these resonance signals are sampled in a sequence of decreasing value of the field gradient $G_z\pm$ in respect of the value of the second field gradient $G_z\pm$, the amplitudes of the resonance signals corresponding to comparatively high values of $G_z\pm$ will be relatively amplified as appears from the equation (5). This implies amplification of the highest image frequencies and hence better definition of the edges in the image. However, when the signals measured at the beginning of the pulse sequence are multiplied by such a factor (smaller than one) that this amplification is eliminated (for a mean or assumed value of $T_1$), such better definition will not be obtained; however, the noise content of the image, notably in the high-frequency part of the spectrum, will then be reduced accordingly.

FIG. 3 shows a pulse sequence which includes a preparatory r.f. electromagnetic 180°-pulse and, in this case two, identical measurement cycles. (In practice, however, a substantially larger number of measurement cycles will be executed during the pulse sequence). Such measurement cycles have already been described with reference to FIG. 1. It is to be noted that the preparatory r.f. electromagnetic pulse, generated during interval 1 which is bounded by the instants $t=-t_a$ and $t=t_{a1}$, can selectively excite spins when a magnetic selection field gradient is applied at the same time. During interval $t_2$, bounded by the instants $t=t_a$ and $t=t_b$, the excited spins of the various chemical components in the body will be reoriented in the direction of the steady, uniform magnetic field at a speed which will depend on their respective longitudinal relaxation times $T_1$. Information as regards these longitudinal relaxation times can be obtained by measuring, at different instants ($t=t_c$, $t=t_d$, etc.) during this relaxation process, the instantaneous magnetization which is situated in the transversal xy-plane due to the influence of the r.f. electromagnetic pulses $\alpha_1$, $\alpha_2$, etc. as echo resonance signals at the instants $t=t_{e1}$, $t=t_{e2}$ etc. Thus, at any instant $t=t_c$, $t=t_d$ etc. an image can be reconstructed by repeating the pulse sequence of FIG. 3 a number of times, each time using a different value of the time integral of the intensity over the duration of the preparatory magnetic field gradient $G_z+$. The image associated with the instant $t=t_c$ and the instant $t=t_d$ then represents the relaxation time $T_1$-dependent intensities of the resonance signals at the instants $t=t_c$ and $t=t_d$, respectively. From a graph in which the intensity is plotted as a function of time, per pixel K different $T_1$-values and the K corresponding densities can be determined if at least 2K different images have been reconstructed at 2K different instants.

The reference numeral 1 in FIG. 4 denotes an initiation unit in which, prior to an experiment, the reference values of parameters which are fixed during the experiment are introduced. These reference values may relates to, for example amplitudes of magnetic field gradients used, a total number of N echo resonance signals to be generated (for example, N=128 or 256), an echo resonance signal number m and a sampling frequency. In 2 an echo resonance signal number m is determined which is equal to the reference value of the number m plus one. Subsequently, in 3 a field gradient $G_y^+$ is applied and an $\alpha°$ pulse is generated. Subsequently, in 4 fields gradients $G_y^-$, $G_x^-$ and $M\Delta G_z^\pm$ are generated. Subsequently, in 5 a field gradient $G_x^+$ is applied and the resonance signal is sampled. Depending on whether more than one echo resonance signal is to be generated and sampled in one cycle, the field gradient $G_x^+$ is inverted in 6; thus, an echo resonance signal is generated which is sampled. When the total number of N resonance signals suitable for the formation of an image has not been generated and sampled during the experiment, in other words m<N, a new cycle will be started. When m=N, the experiment is stopped.

What is claimed is:

1. In a method of determining a nuclear magnetization distribution in a region of a body situated in a steady, uniform magnetic field, said method comprising the steps of:
   (a) generating a high frequency electromagnetic excitation pulse so as to cause precessional motion of spin nuclei in the region of the body to thereby produce a resonance signal,
   (b) applying at least one magnetic field gradient during a preparation period,
   (c) sampling said resonance signal during a measurement period, and
   (d) repeating a measurement cycle comprised of steps (a), (b) and (c), the time integral of said preparatory magnetic field gradient having a different value during each repetition of said measurement cycle, the improvement wherein said excitation pulses used to produce said resonance signals during repetition of said measurement cycle are exclusively $\alpha°$ excitation pulses which rotate the magnetization direction of spin nuclei in said region through an angle $\alpha°$, where $\alpha°$ is greater than 0° and less than 90°, and including the step of applying, during said measurement period, a further magnetic field gradient which is inverted with respect to said at least one magnetic field gradient so that said resonance signal is sampled in the presence of said further magnetic field gradient.

2. The method according to claim 1 wherein the step of generating said excitation pulse of one measurement cycle follows directly after the sampling step of the preceding measurement cycles without a waiting period therebetween.

3. The method according to claim 1 wherein at least one sequence of a plurality of measurements cycles is carried out with different intensities of said excitation pulse and/or different values of a repetition period, $T_R$, between successive excitation pulses.

4. A method according to claim 1, 2 or 3 wherein during at least one measurement cycle, N resonance signals are sampled during N successive measurement periods, said further gradient field being inverted during each successive measurement period with respect to said further gradient field applied during the preceding measurement period of said at least one measurement cycle.

5. The method according to claim 1 or 2 wherein a dephasing magnetic field gradient is applied in order to dephase undesirable components of the magnetization in a measurement direction, said dephasing gradient being applied during a measurement period immediately after a resonance signal to be sampled is sustained for some time immediately after expiration of a measurement period and/or is applied for some time prior to generation of said excitation pulse during a cycle.

6. The method according to claim 1 or 2 wherein during a period of motion of the object to be examined, resonance signals are generated which correspond to different phases of said period of motion, and wherein samples of said resonance signals are processed so as to form images which can be displayed in a sequence.

7. The method according to claim 1 or 2 wherein two additional magnetic field gradients having mutually perpendicular gradient directions are applied during said preparation period.

8. The method according to claim 1 or 2 wherein the longitudinal relaxation time $T_1$ per volume element is calculated from the intensities of volume elements in an image which have been obtained from at least two of said measurement cycles which differ from each other either with respect to the angle of said excitation pulses and/or the repetition time $T_R$ between successive excitation pulses.

9. The method according to claim 8 wherein the longitudinal relaxation time $T_1$ is calculated by means of the formula $$I_p = \frac{c \sin \alpha (1 - e^{-T_R/T_1})}{(1 - \cos \alpha \, e^{-T_R/T_1})}$$

wherein $I_p$ is the intensity of a volume element p, $T_R$ is the repetition time between successive excitation pulses, $T_1$ is the longitudinal relaxation time, and c is a constant which does not depend on $\alpha$, $T_R$ or $T_1$, 10. The method according to claim 1 or 2 wherein a dephasing magnetic gradient field having a gradient direction which is perpendicular to the gradient direction of said at least one field gradient is applied during said preparation period.

11. The method according to claim 10 wherein said dephasing magnetic field gradient has a constant magnitude and the time integral of said dephasing magnetic field gradient is varied during different measurement cycles by inverting said dephasing gradient during a portion of said preparation period and varying the duration of said portion of said dephasing period during which said preparatory gradient is inverted.

12. The method according to claim 10 wherein at least for a sequence of said measurement cycles, the absolute value of the time integral of said dephasing magnetic field gradient either increases or decreases from cycle to cycle in said sequence.

13. In an apparatus for determining the nuclear magnetization distribution in a region of a body, said apparatus comprising:
   (a) means for generating a steady, uniform magnetic field,
   (b) means for generating a high frequency electromagnetic excitation pulse so as to cause precessional motion of spin nuclei in a region of a body to be examined thereby producing a resonance signal, (c) means for generating a preparatory magnetic field gradient and at least one additional magnetic field gradient during a preparation period, (d) sampling means for taking signal samples of said resonance signal after said resonance signal is conditioned by said preparatory magnetic field, (e) processing means for processing said signal samples supplied by said sampling means, and (f) control means for controlling said means specified in paragraphs (b) to (e) so as to produce, condition, sample and process a plurality of said resonance signals produced during successive measurement cycles, said control means controlling said preparatory gradient generating means so as to vary the intensity and/or duration of said preparatory gradient such that the time integral of said gradient is different for different measurement cycles, the improvement wherein said high frequency electromagnetic pulses are exclusively $\alpha°$ pulses which rotate the magnetization direction of spin nuclei through an angle $\alpha°$, where $\alpha°$ is greater than 0° and less than 90°, and including means for applying a further magnetic field gradient which is inverted with respect to said at least one additional gradient, said means for applying said further gradient being controlled by said control means so that said further gradient is applied during said measurement period so that said signal samples are taken by said sampling means in the presence of said further magnetic field gradient.

14. The apparatus according to claim 13 wherein said control means controls said preparatory gradient generating means so that the time integral of said preparatory gradient has an absolute value which either decreases or increases from measurement cycle to measurement cycle for a given sequence of measurement cycles.

15. A method of determining a nuclear magnetization distribution in a region of a body situated in a steady, uniform magnetic field, said method comprising the steps of:

(a) generating a first high frequency electromagnetic pulse, (b) generating an r.f. $\alpha°$ pulse which rotates the magnetization direction of spin nuclei in said region through an angle $\alpha$, where $0° < \alpha < 90°$, (c) applying at least one preparatory magnetic field gradient during a preparation period, (d) generating a resonance signal by rephasing the spin nuclei with a bipolar magnetic field gradient applied after generation of said $\alpha°$ pulse, (e) sampling said resonance signal during a measurement period, (f) repeating a subcycle comprised of steps (b), (c) (d) and (e) with the same value of the time integral of said preparatory gradient during each repetition of said subcycle, and (g) then repeating a measurement cycle comprised of steps (a), (b), (c), (d), (e) and (f) with a different value of the time integral for each repetition of said measurement cycle.

16. The method according to claim 15 including the step of applying a selection magnetic field gradient so as to selectively excite spin nuclei in said body, said selection gradient being applied during the interval when said $\alpha°$ pulse is generated.

17. The method according to claim 15 or 16 wherein said first pulse is a 180° pulse.

18. The method according to claim 15 or 16 wherein different $\alpha°$ pulses are generated so as to rotate the magnetization direction of said spin nuclei through different angles during different subcycles of a given measurement cycle.

* * * * *